US009852868B2

(12) United States Patent
Yamagishi et al.

(10) Patent No.: US 9,852,868 B2
(45) Date of Patent: Dec. 26, 2017

(54) CHIP FUSE AND MANUFACTURING METHOD THEREFOR

(71) Applicant: KAMAYA ELECTRIC CO., LTD., Ayase-shi, Kanagawa (JP)

(72) Inventors: Katsuya Yamagishi, Sorachi-gun (JP); Hideki Seino, Ayase (JP)

(73) Assignee: KAMAYA ELECTRIC CO., LTD., Ayase-shi (JP)

(*) Notice: Subject to any disclaimer, the term of this patent is extended or adjusted under 35 U.S.C. 154(b) by 100 days.

(21) Appl. No.: 14/432,128

(22) PCT Filed: Sep. 28, 2012

(86) PCT No.: PCT/JP2012/075009
§ 371 (c)(1),
(2) Date: Mar. 27, 2015

(87) PCT Pub. No.: WO2014/049809
PCT Pub. Date: Apr. 3, 2014

(65) Prior Publication Data
US 2015/0270085 A1 Sep. 24, 2015

(51) Int. Cl.
*G06F 1/16* (2006.01)
*H05K 5/00* (2006.01)
(Continued)

(52) U.S. Cl.
CPC ........ *H01H 85/0013* (2013.01); *H01H 69/02* (2013.01); *H01H 85/046* (2013.01);
(Continued)

(58) Field of Classification Search
CPC ........... H01H 85/0013; H05K 13/0413; H05K 13/022; H05K 13/02; H05K 13/00
(Continued)

(56) References Cited

U.S. PATENT DOCUMENTS 5,552,757 A * 9/1996 Blecha .................. H01C 7/006 29/623
5,699,032 A * 12/1997 Ulm, Jr. ............... H01H 69/022 337/227

(Continued)

FOREIGN PATENT DOCUMENTS

CN 1925087 A 3/2007
EP 0 270 954 A1 6/1988

(Continued)

*Primary Examiner* — Anthony Haughton
(74) *Attorney, Agent, or Firm* — Birch, Stewart, Kolasch & Birch, LLP

(57) ABSTRACT

In a chip fuse, a heat-storing layer is formed on an insulated substrate, a fuse film is formed on the heat-storing layer, and a protective film is formed on the fuse element section. The chip fuse includes surface electrode sections on both ends in the length direction of the chip fuse and a fuse element section between the surface electrode sections. In this chip fuse, a rectangular bank section is formed over the heat-storing layer and the surface electrode sections to surround the fuse element section, and a first protective layer is formed on the inner side of the bank section. In addition, during the bank formation process, a sheet-like photosensitive-group-containing material is laminated on the fuse element section, surface electrode sections, and heat-storing layer, and the sheet-like photosensitive-group-containing material is exposed to ultraviolet light and developed to form the rectangular bank section.

13 Claims, 12 Drawing Sheets

(51) Int. Cl.

| | |
|---|---|
| ***H05K 7/00*** | (2006.01) |
| ***H01H 85/00*** | (2006.01) |
| ***H01H 85/046*** | (2006.01) |
| ***H01H 69/02*** | (2006.01) |
| ***H01H 85/48*** | (2006.01) |
| ***H01H 85/38*** | (2006.01) |
| *H01H 85/143* | (2006.01) |

(52) U.S. Cl.
CPC ............ *H01H 85/38* (2013.01); *H01H 85/48* (2013.01); *H01H 69/022* (2013.01); *H01H 85/143* (2013.01); *H01H 2069/025* (2013.01); *H01H 2085/383* (2013.01); *Y10T 29/49107* (2015.01)

(58) Field of Classification Search
USPC ............... 337/222, 296; 439/620.33, 620.34, 439/620.26, 620.27, 620.29, 374; 361/679.38, 679.01
See application file for complete search history.

(56) References Cited

U.S. PATENT DOCUMENTS

| | | | | | |
|---|---|---|---|---|---|
| 5,790,008 | A * | 8/1998 | Blecha | H01C 17/08 | 29/623 |
| 5,977,860 | A * | 11/1999 | Ulm, Jr. | H01H 69/022 | 337/227 |
| 6,002,322 | A * | 12/1999 | Krueger | H01H 69/022 | 29/623 |
| 6,043,966 | A * | 3/2000 | Krueger | H01H 69/022 | 361/104 |
| 6,078,245 | A * | 6/2000 | Fritz | H01H 85/046 | 337/160 |
| 7,570,148 | B2 * | 8/2009 | Parker | H01H 85/046 | 337/227 |
| 2004/0169578 | A1 * | 9/2004 | Jollenbeck | H01H 85/046 | 337/227 |
| 2008/0191832 | A1 * | 8/2008 | Tsai | H01H 69/022 | 337/297 |
| 2012/0222947 | A1 | 9/2012 | Chang | | |
| 2016/0013001 | A1 * | 1/2016 | Yoneda | H01H 85/11 | 337/227 |

FOREIGN PATENT DOCUMENTS

| | | | |
|---|---|---|---|
| JP | 62-55832 | A | 3/1987 |
| JP | 63-141233 | A | 6/1988 |
| JP | 10-308160 | A | 11/1998 |
| JP | 10-308161 | A | 11/1998 |
| JP | 11-126556 | A | 5/1999 |
| JP | 2003-173728 | A | 6/2003 |
| JP | 2007-95469 | A | 4/2007 |
| JP | 2010-219063 | A | 9/2010 |
| JP | 2012-182108 | A | 9/2012 |
| KR | 10-2009-0040249 | A | 4/2009 |
| KR | 10-2009-0115652 | A | 11/2009 |

* cited by examiner

[FIG. 1]
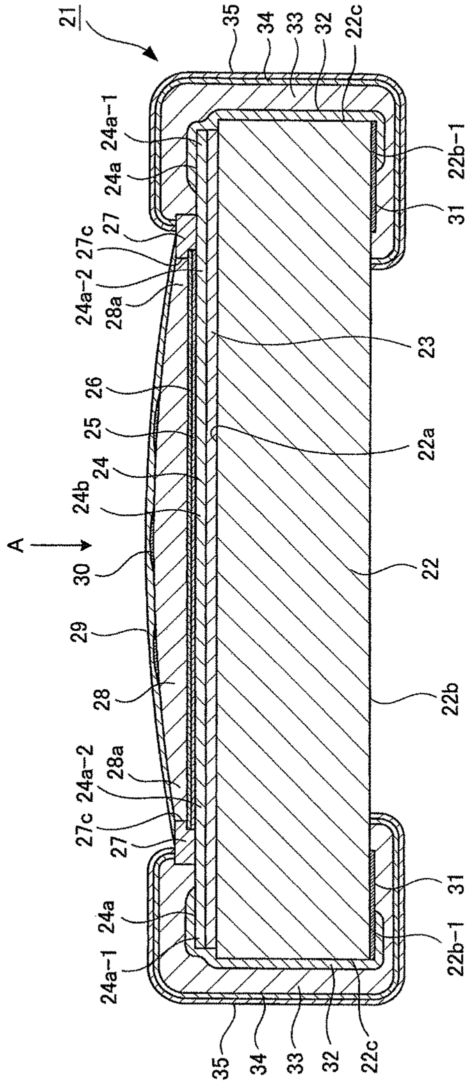

[FIG. 2]
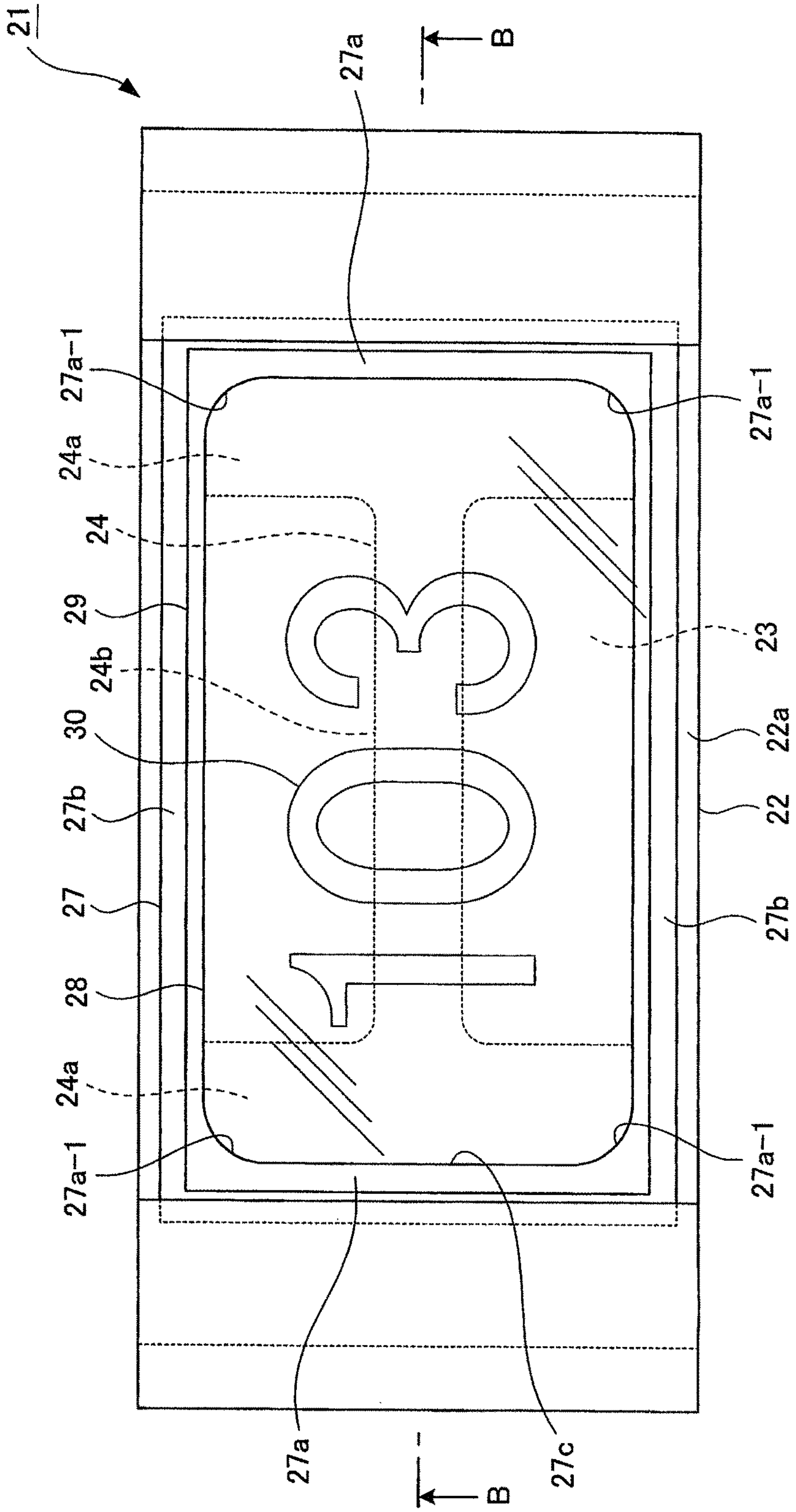

[FIG. 3]
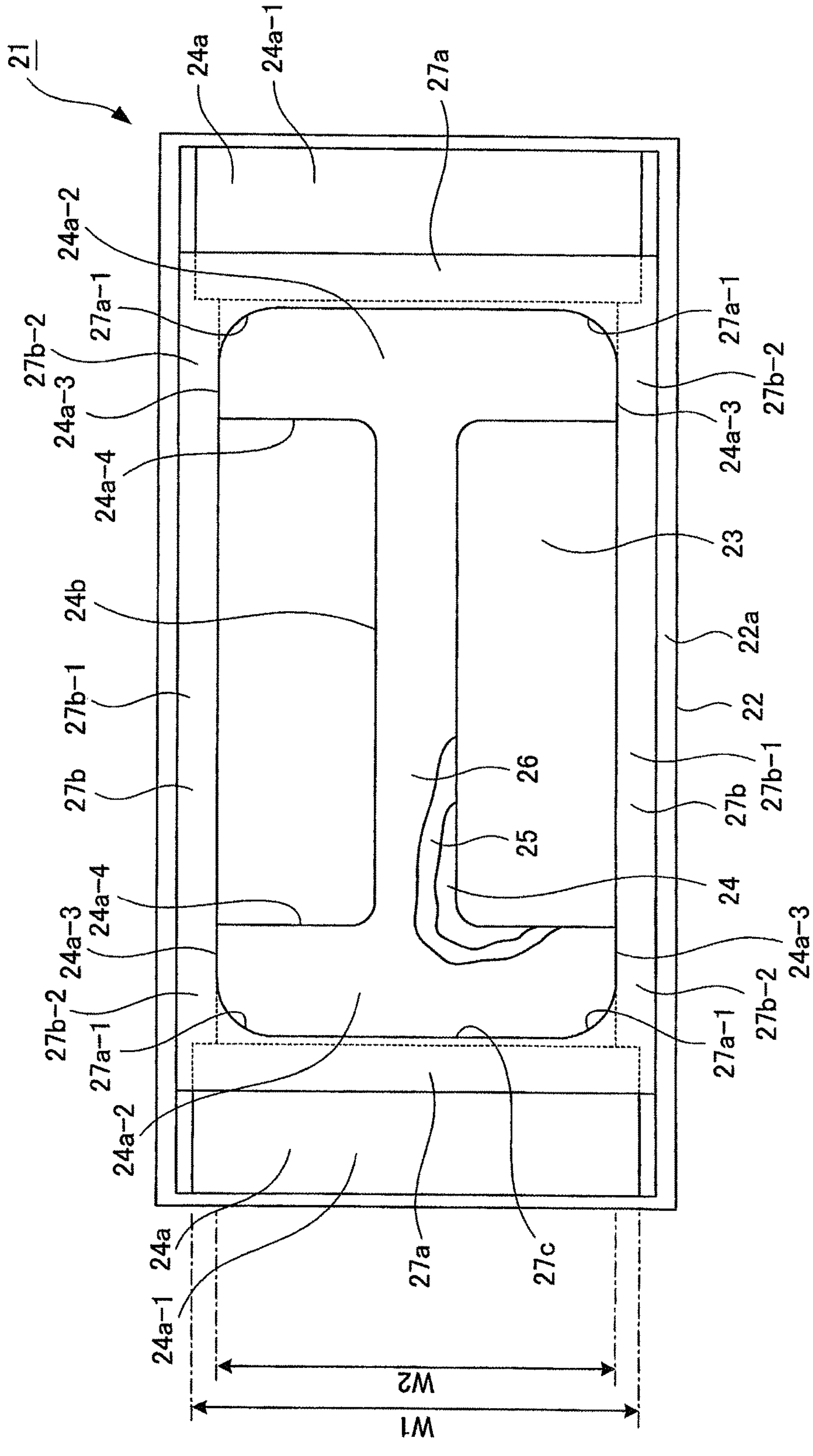

[FIG. 4]
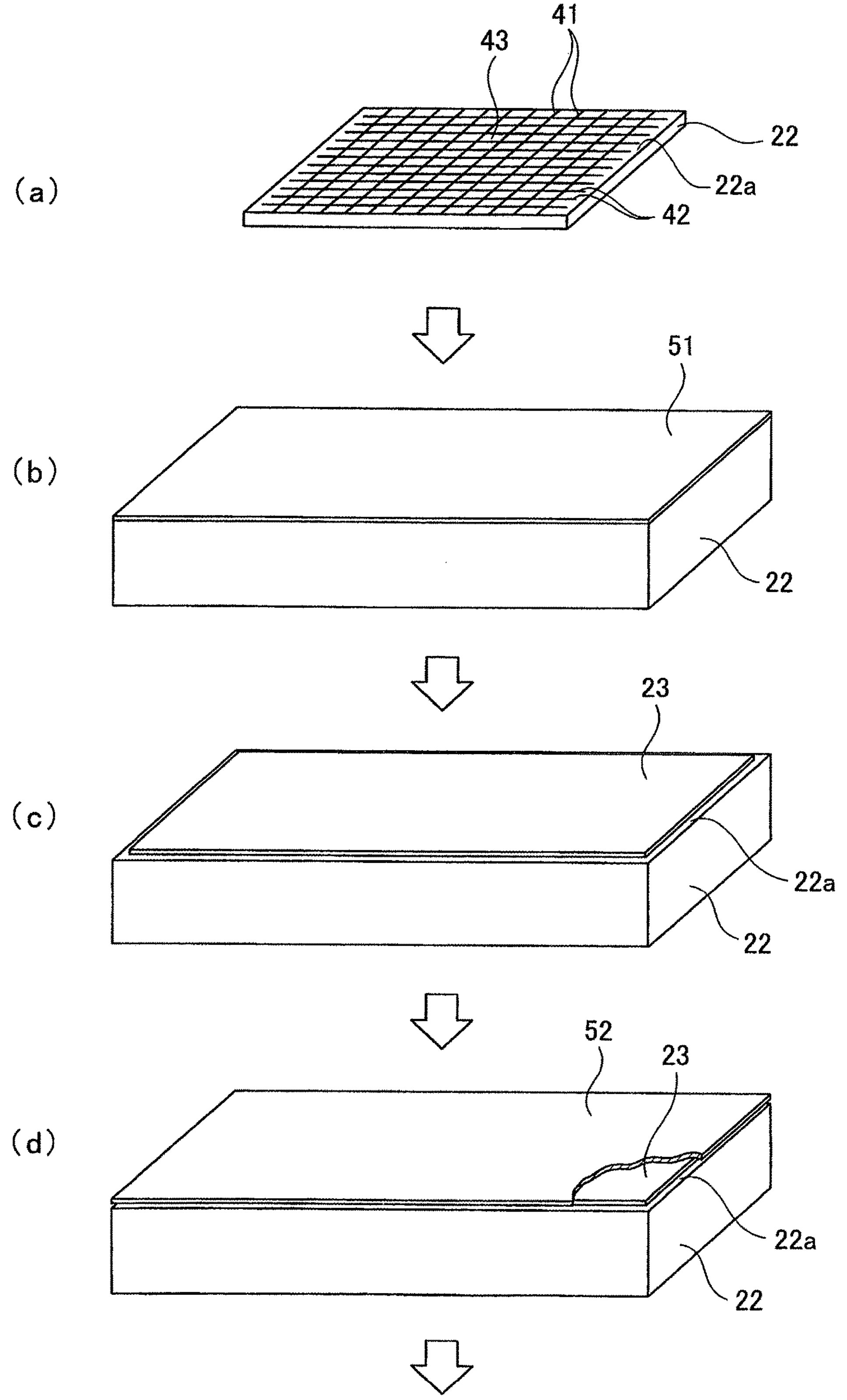
TO FIG. 5

[FIG. 5]
FROM FIG. 4
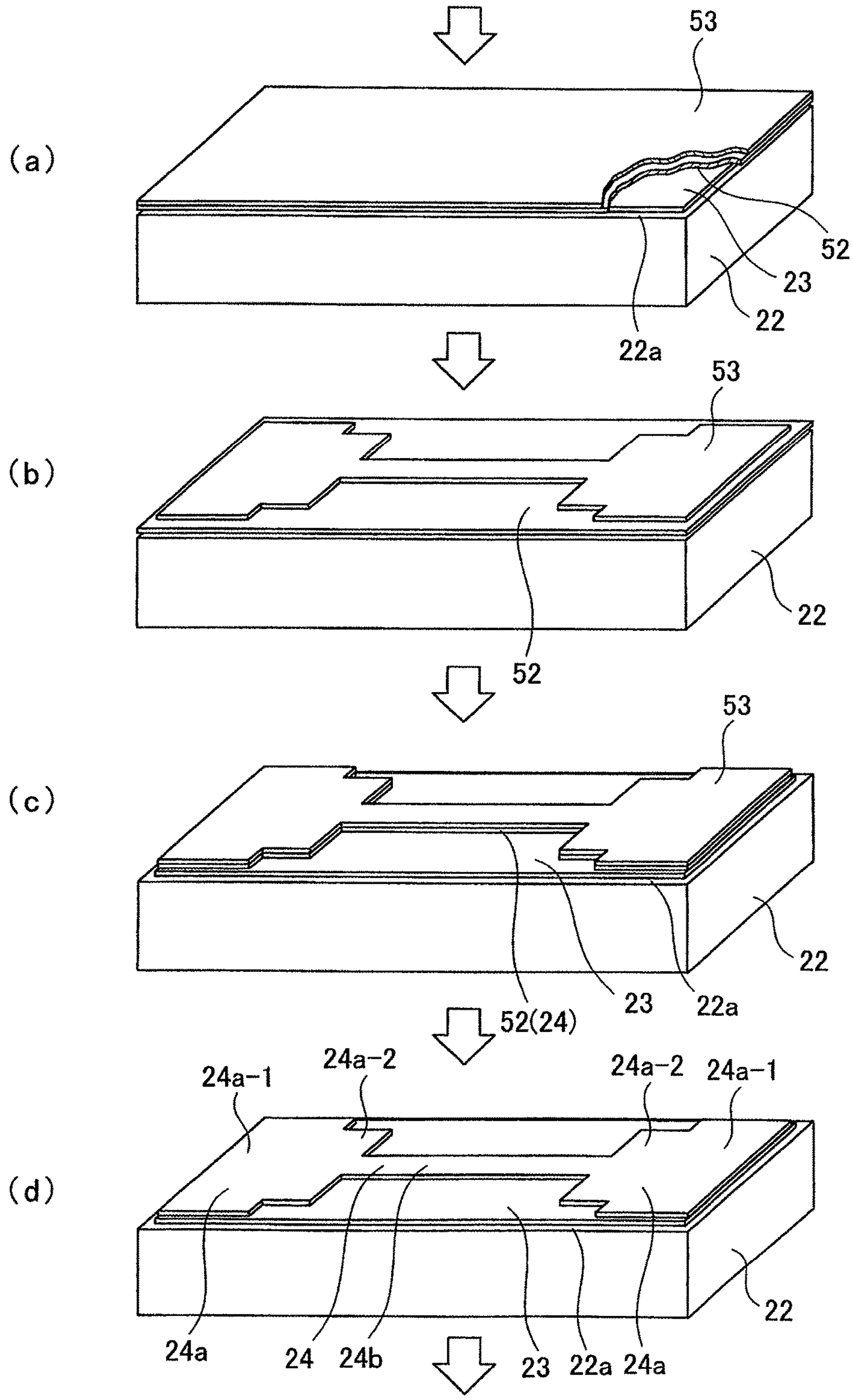
TO FIG. 6

[FIG. 6]
FROM FIG. 5
(a)
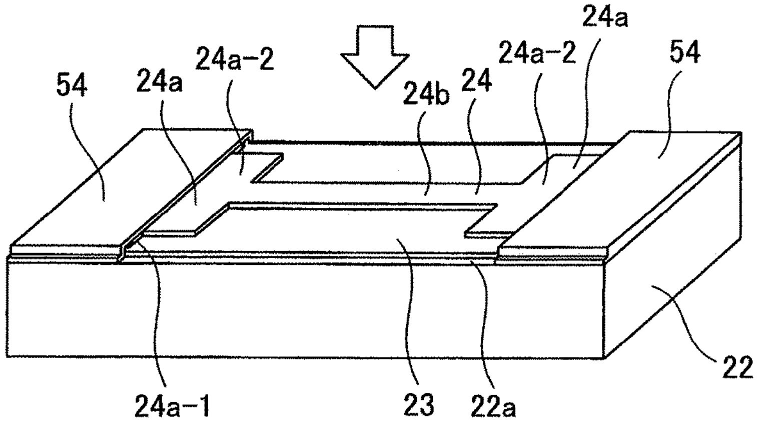
(b)
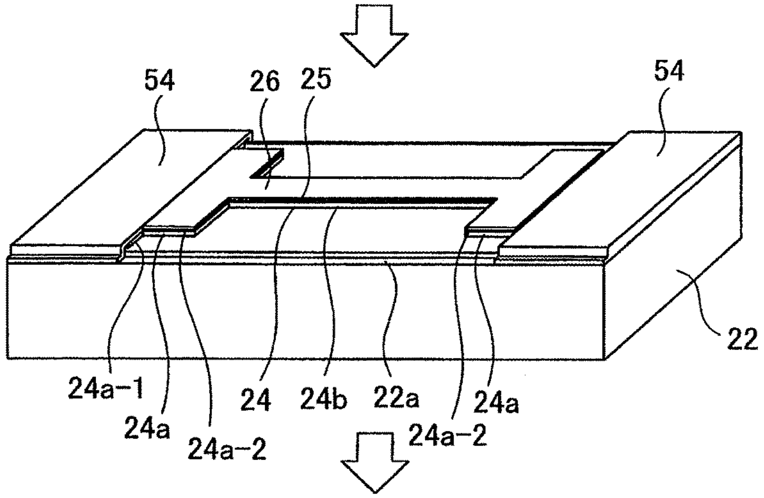
(c)
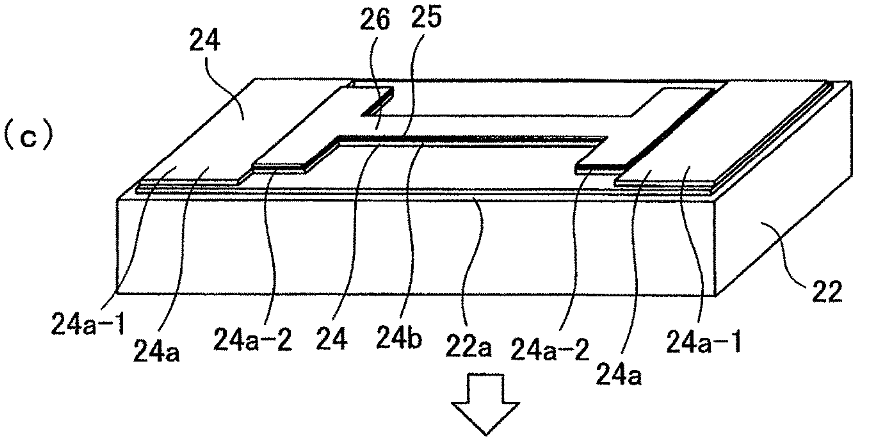
TO FIG. 7

[FIG. 7]
FROM FIG. 6
(a)
(b)
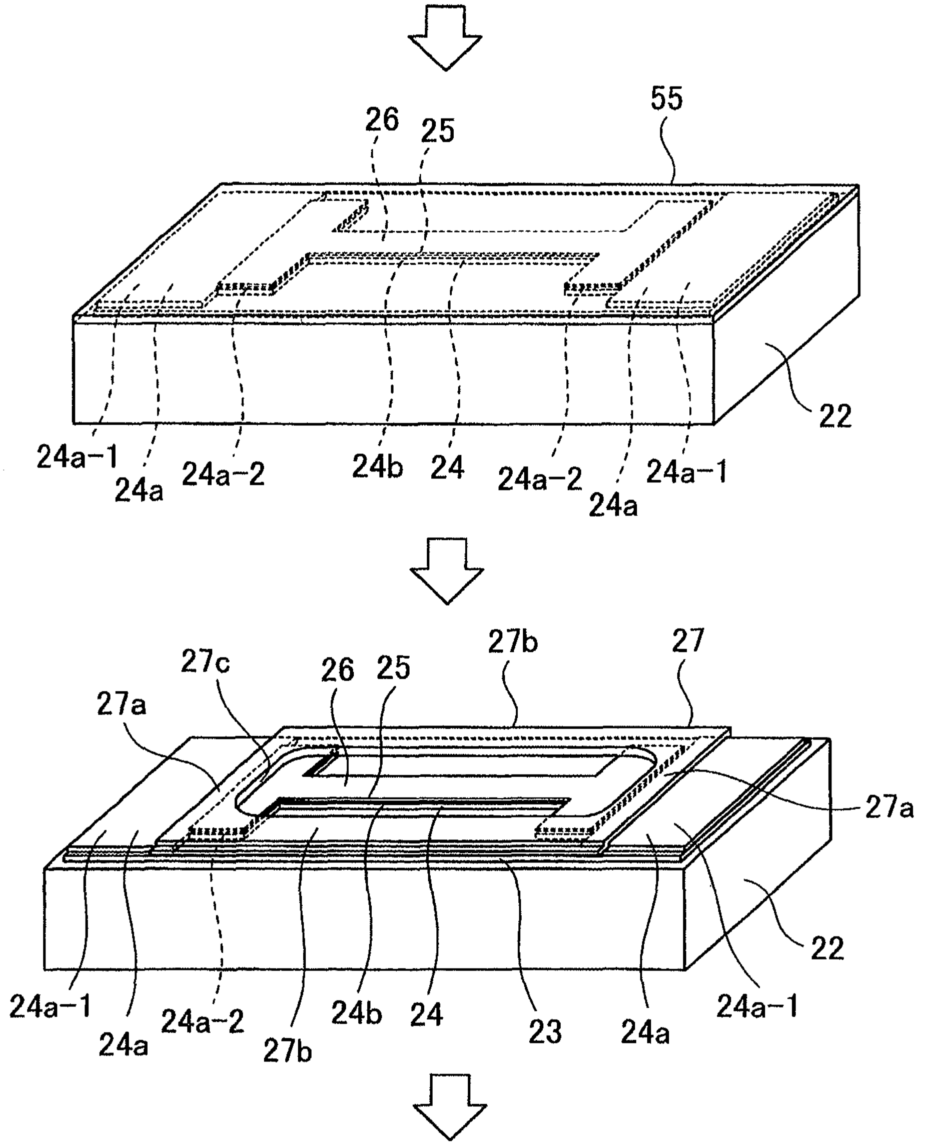
TO FIG. 8

[FIG. 8]
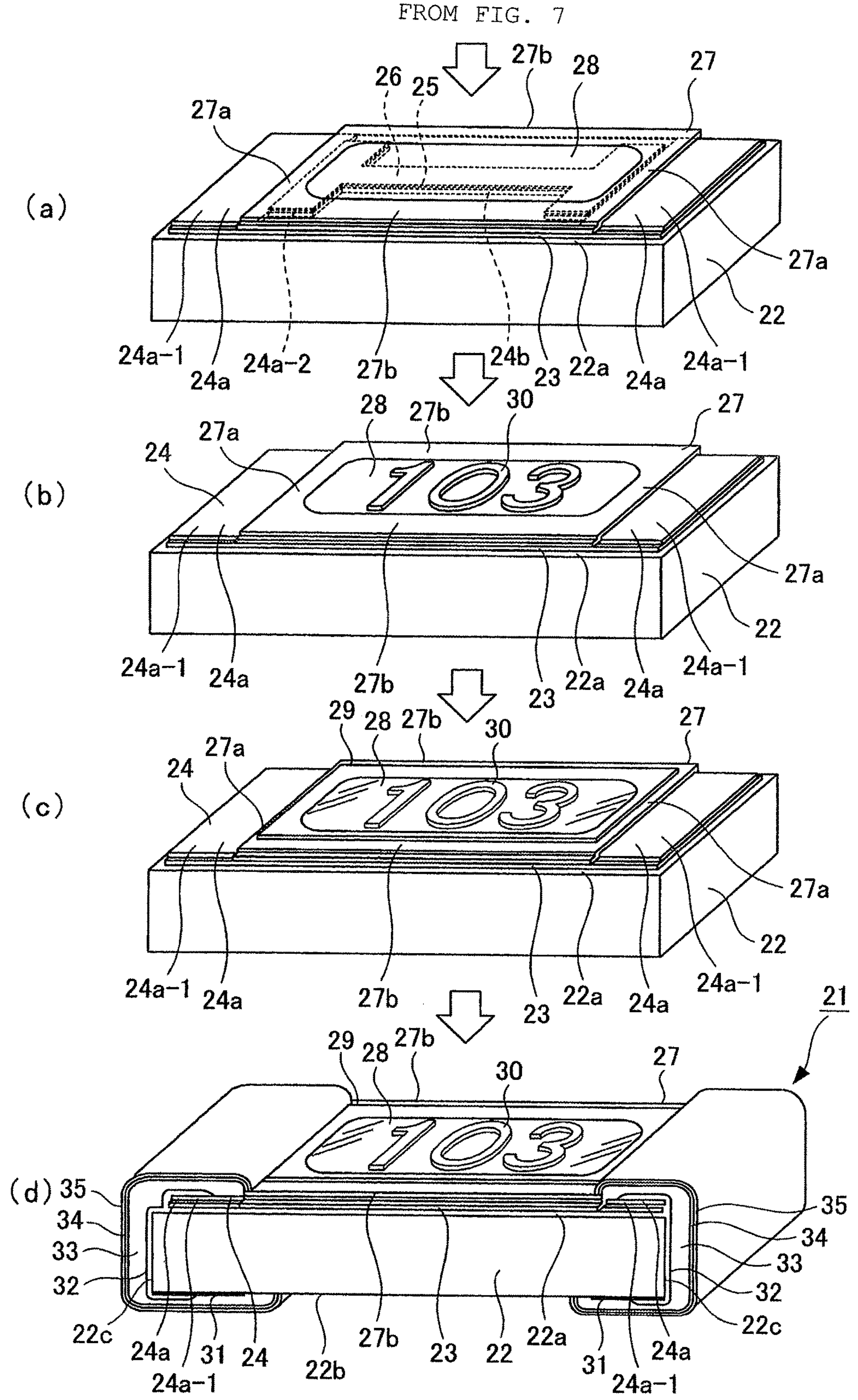

[FIG. 9]
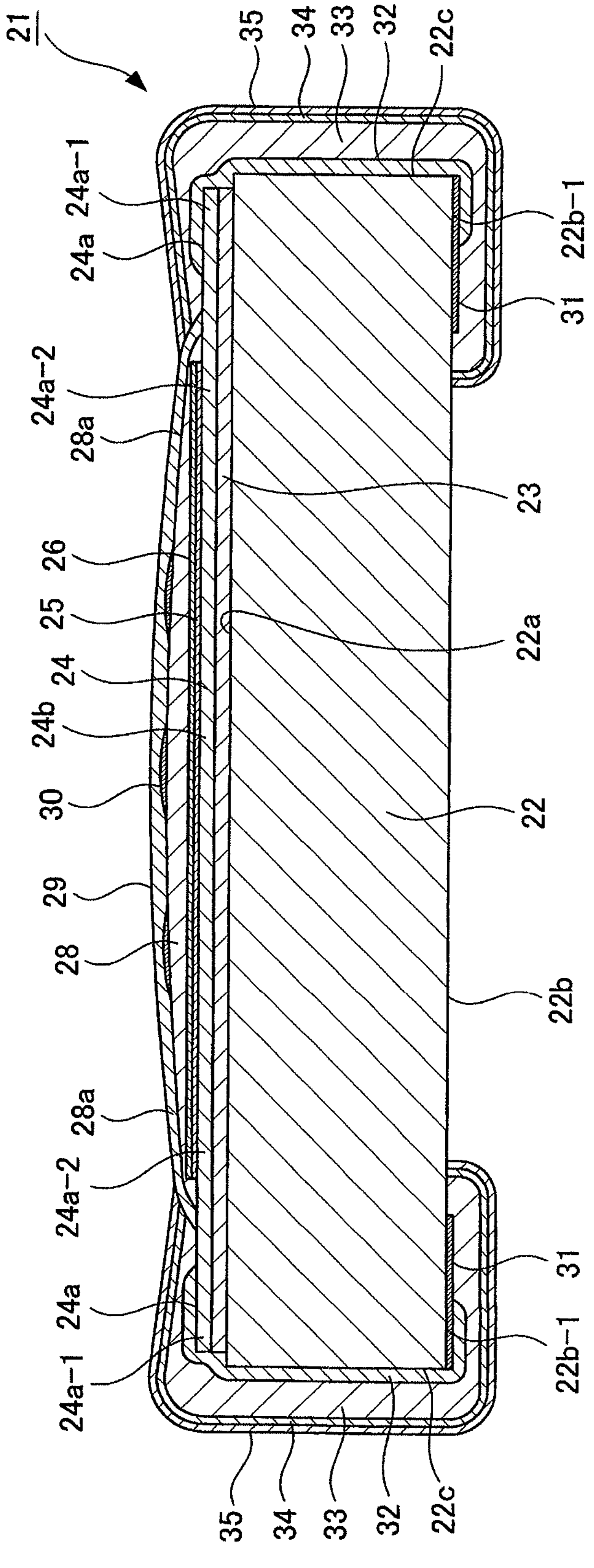

[FIG. 10]
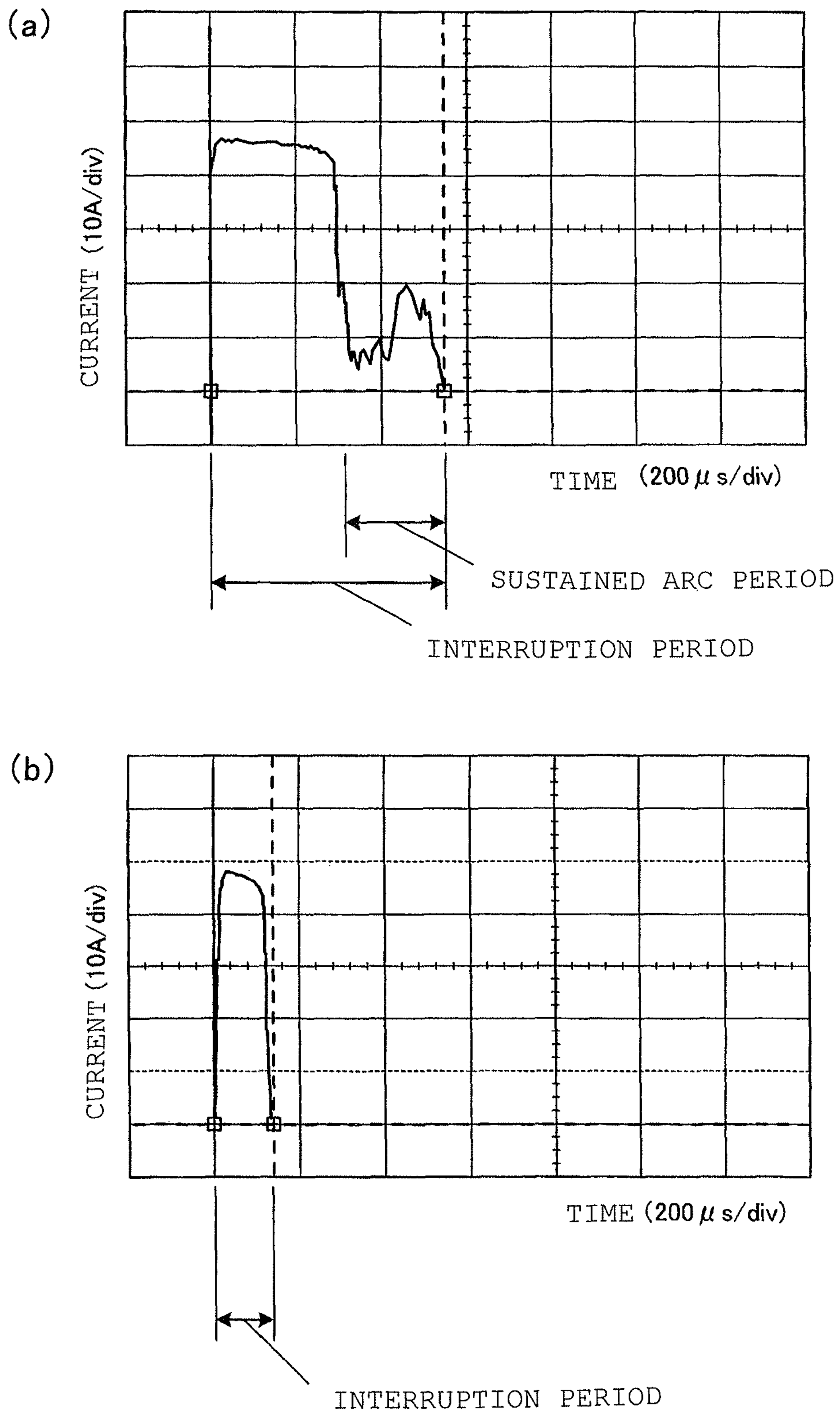

[FIG. 11]
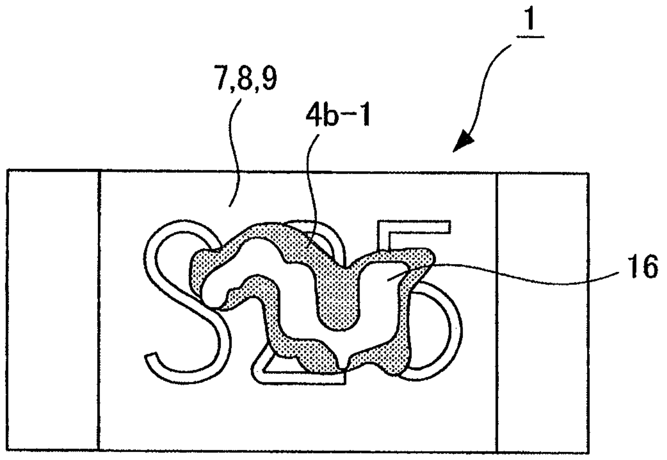

[FIG. 12]
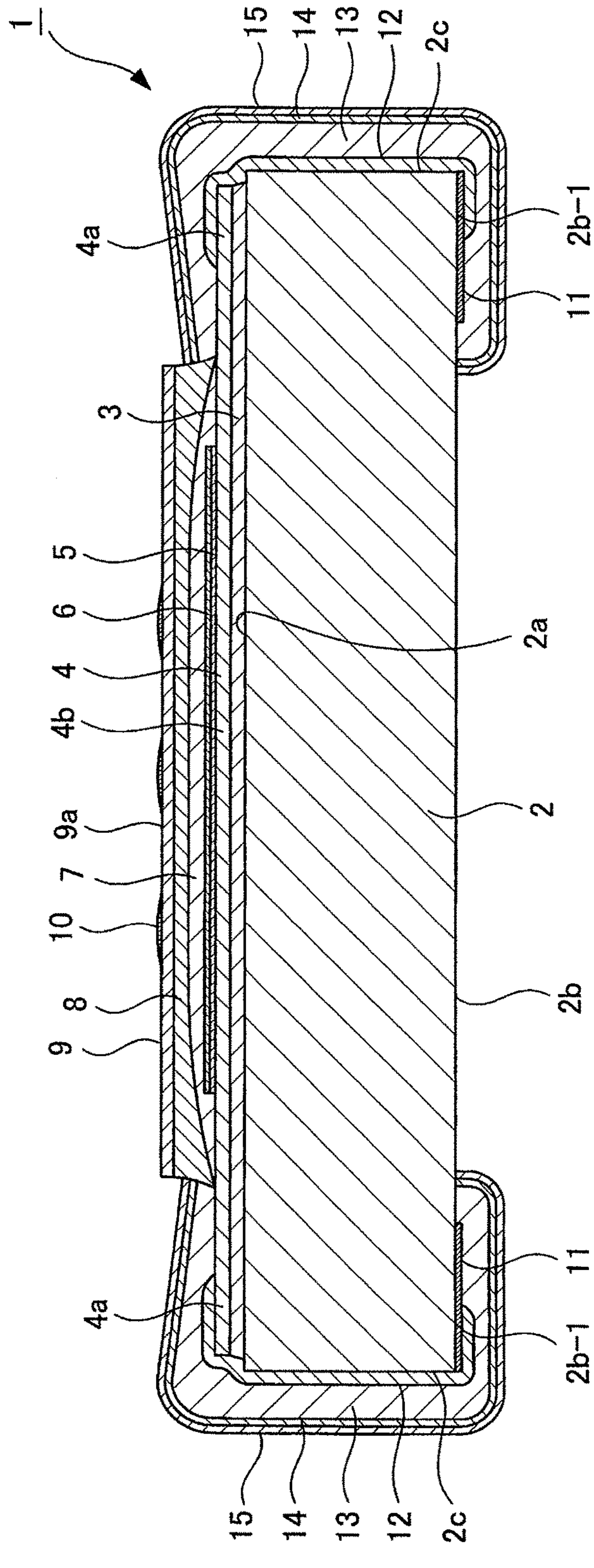

CHIP FUSE AND MANUFACTURING METHOD THEREFOR

TECHNICAL FIELD

The present invention relates to a chip fuse and a manufacturing method for the same.

BACKGROUND ART

Heretofore, a chip fuse which is a miniature fuse has been known as one component surface-mounted on a printed circuit board of an electronic device. Such a chip fuse prevents overcurrent damage to an electronic circuit on the printed circuit board.

FIG. 12 shows a cross-sectional view of a conventional chip fuse 1. As shown in this figure, a heat-storing layer (adhesion layer) 3 made of an epoxy-based resin is formed on a surface 2*a* of an insulated substrate 2 that is an alumina substrate. A fuse film 4 made of copper is formed on the heat-storing layer 3. Specifically, interposing the heat-storing layer 3 between the insulated substrate 2 and the fuse film 4 prevents the fuse film 4 from coming into contact with the insulated substrate 2. Hence, when a current passes through the chip fuse 1, heat generated at a fuse element section 4*b* is stored in the heat-storing layer 3 without dissipating to the insulated substrate 2.

The fuse film 4 includes surface electrode sections 4*a* on both ends in a length direction of the chip fuse 1 (a right-left direction in FIG. 12: hereinafter, this is simply referred to as chip fuse length direction), and the fuse element section (fuse element) 4*b* between the surface electrode sections 4*a*. The fuse element section 4*b* is a melting section configured to be melted by heat generated at the fuse element section 4*b* when an overcurrent flows through the chip fuse 1. The section has a width narrower than the surface electrode sections 4*a*. The fuse element section 4*b* is provided with a plating film 5 for preventing diffusion, and a plating film 6 for facilitating the melting. The plating film 5 is a nickel film formed on the copper fuse film 4 by an electroplating method. The plating film 6 is a tin film formed on the nickel film 5 by an electroplating method.

Moreover, a first protective layer 7 made of an epoxy-based resin is formed on the fuse element section 4*b* (tin film 6), the first protective layer 7 serving as an undercoat. Further, a second protective layer 8 made of an epoxy-based resin is formed on the first protective layer 7, the second protective layer 8 serving as a first overcoat. A third protective layer 9 made of an epoxy-based resin is formed on the second protective layer 8, the third protective layer 9 serving as a second overcoat. A mark 10 is formed on a surface 9*a* of the third protective layer 9 by laser marking. The mark 10 indicates the rated current and the like of the chip fuse 1.

Backside electrodes 11 made of a silver-containing resin are formed on sections 2*b*-1 on both ends in the chip fuse length direction of a back surface 2*b* of the insulated substrate 2. End surface electrodes 12 made of a silver-containing resin are formed on end surfaces 2*c* on both ends in the chip fuse length direction of the insulated substrate 2. Each of the end surface electrodes 12 is formed across from the surface electrode section 4*a* to the backside electrode 11, electrically connecting the surface electrode section 4*a* and the backside electrode 11 to each other.

Moreover, the end surface electrode 12 is provided with plating films 13, 14, 15. The plating film 13 is a copper film formed on the end surface electrode 12 by an electroplating method. The plating film 14 is a nickel film formed on the copper film 13 by an electroplating method. The plating film 15 is a tin film formed on the nickel film 14 by an electroplating method. These plating films 13, 14, 15 are formed across from the surface electrode section 4*a* to the back surface 2*b* of the insulated substrate 2, covering the end surface electrode 12 and the backside electrode 11 entirely.

Incidentally, the following Patent Documents 1 to 3 are examples of prior art documents disclosing chip fuses.

PRIOR ART DOCUMENTS

Patent Documents

Patent Document 1: Japanese Patent Application Publication No. Hei 10-308160

Patent Document 2: Japanese Patent Application Publication No. Hei 10-308161

Patent Document 3: Japanese Patent Application Publication No. Sho 63-141233

SUMMARY OF THE INVENTION

Problems to be Solved by the Invention

Recent demands for further reducing the size of electronic devices and for improving the reliability, and other demands have made demands for further improvements in interruption performances of chip fuses. The interruption performances of a chip fuse include a change in appearance before and after an interruption, a sustained arc during an interruption, and so forth. A chip fuse having high interruption performances is capable of retaining an appearance as before an interruption while inhibiting a matter from scattering even after the interruption, and has a short sustained arc period during the interruption.

In order to check such interruption performances, Interruption Tests A, B have been conducted on the above-described conventional chip fuse 1 under various test conditions as follows.

Interruption Test A is an interruption test with 32 V and 50 A. The chip fuse 1 subjected to this Interruption Test A had a resistance value of 0.029Ω before the interruption test. Although the illustration is omitted, the interruption period was 0.38 ms as a result of conducting Interruption Test A. Moreover, a sustained arc was observed only to a lesser degree. In addition, portions of the protective layers 7, 8, 9 appeared to be damaged and scattered by the impact (pressure) in the melting of the fuse element section 4*b*, while a melt 4*b*-1 of the fuse element section 4*b* attached around the damaged portions of the protective layers 7, 8, 9. Since the protective layers 7, 8, 9 formed of the epoxy-based resin are relatively hard, the layers are likely to be damaged by the impact.

Interruption Test B is an interruption test with 76 V and 50 A. The chip fuse 1 subjected to this Interruption Test B had a resistance value of 0.029Ω before the interruption test. As a result of conducting Interruption Test B, the interruption period was 0.55 ms, and a sustained arc was observed as long as approximately 0.2 ms, as shown in FIG. 10(*a*). Moreover, as shown in FIG. 11, portions of the protective layers 7, 8, 9 appeared to be damaged and scattered by the impact (pressure) in the melting of the fuse element section 4*b*, while a melt 4*b*-1 of the fuse element section 4*b* attached around damaged portions 16 of the protective layers 7, 8, 9.

Therefore, in view of the above-described circumstances, an object of the present invention is to provide a chip fuse and a manufacturing method for the same, the chip fuse being capable of improving interruption performances such as retention of appearance and reduction of sustained arc.

Means for Solving the Problems

A chip fuse according to a first aspect of the invention for attaining the above object is a chip fuse comprising:

an insulated substrate;

a heat-storing layer formed on the insulated substrate:

a fuse film formed on the heat-storing layer, the fuse film comprising surface electrode sections on both ends in a chip fuse length direction and a fuse element section between the surface electrode sections; and a protective layer formed on the fuse element section, characterized in that a rectangular bank section is formed on the heat-storing layer and the surface electrode sections in such a manner as to surround the fuse element section, and the protective layer is formed on an inner side of the bank section.

Further, a chip fuse according to a second aspect of the invention is the chip fuse according to the first aspect of the invention, characterized in that the bank section includes sections on both ends in the chip fuse length direction, the sections being formed outwardly in the chip fuse length direction of ends at inner sides in the chip fuse length direction of the surface electrode sections.

Further, a chip fuse according to a third aspect of the invention is the chip fuse according to any one of the first and the second aspects of the invention, characterized in that the surface electrode sections each include a first electrode section at an outer side in the chip fuse length direction, and a second electrode section at an inner side in the chip fuse length direction, the second electrode section has a width narrower than a width of the first electrode section, the bank section includes sections on both ends in a chip fuse width direction, the sections being provided on the heat-storing layer and formed outwardly in the chip fuse width direction of ends on both ends in the chip fuse width direction of the second electrode section, and the heat-storing layer and the bank section are formed of the same material.

Further, a chip fuse according to a fourth aspect of the invention is the chip fuse according to the third aspect of the invention, characterized in that the heat-storing layer and the bank section are formed of the same photosensitive-group-containing material.

Further, a chip fuse according to a fifth aspect of the invention is the chip fuse according to any one of the first to the fourth aspects of the invention, characterized in that the protective layer is formed of an epoxy-group-containing silicone-based resin.

Further, a chip fuse according to a sixth aspect of the invention is the chip fuse according to the fifth aspect of the invention, characterized in that another protective layer made of an inorganic-filler-containing silicone-based resin is formed on the protective layer.

Further, a chip fuse according to a seventh aspect of the invention is the chip fuse according to the sixth aspect of the invention, characterized in that the other protective layer is formed to have a thickness smaller than the protective layer.

Further, a chip fuse according to an eighth aspect of the invention is the chip fuse according to any one of the sixth and the seventh aspects of the invention, characterized in that the other protective layer is transparent, and a mark made of a silicone-based resin is formed on the protective layer and provided between the protective layer and the other protective layer.

Further, a manufacturing method for a chip fuse according to a ninth aspect of the invention is a manufacturing method for the chip fuse according to any one of the first to the eighth aspects of the invention, characterized in that the manufacturing method comprises:

a first step of forming the rectangular bank section on the heat-storing layer and the surface electrode sections; and a second step of forming the protective layer on the inner side of the bank section.

Further, a manufacturing method for a chip fuse according to a tenth aspect of the invention is the manufacturing method for a chip fuse according to the ninth aspect of the invention, characterized in that the first step includes:

laminating a sheet-shaped photosensitive-group-containing material on the fuse element section, the surface electrode sections, and the heat-storing layer; and exposing the sheet-shaped photosensitive-group-containing material to ultraviolet light for development (photo-etching) to thereby form the rectangular bank section.

Effects of the Invention

In the chip fuse according to the first aspect of the invention, the heat-storing layer is formed on the insulated substrate; the fuse film is formed on the heat-storing layer, the fuse film including the surface electrode sections on both ends in the chip fuse length direction and the fuse element section between the surface electrode sections; and the protective layer is formed on the fuse element section. The chip fuse is characterized in that: the rectangular bank section is formed on the heat-storing layer and the surface electrode sections in such a manner as to surround the fuse element section; and the protective layer is formed on the inner side of the bank section. Accordingly, when the protective layer is formed, the rectangular bank section makes it possible to block the material for forming the protective layer (for example, epoxy-group-containing silicone-based resin) from flowing and spreading therearound. Thus, the protective layer is sufficiently ensured. Further, the thickness of the protective layer even at end sections thereof is not reduced, and a sufficiently large thickness is ensured. Hence, it is possible to prevent the protective layer from being damaged by an impact (pressure) in the melting of the fuse element section.

According to the chip fuse according to the second aspect of the invention, the chip fuse according to the first aspect of the invention is characterized in that the sections on both ends in the chip fuse length direction of the bank section are formed outwardly in the chip fuse length direction of the ends at the inner sides in the chip fuse length direction of the surface electrode sections. Accordingly, the sections on both ends in the chip fuse length direction of the bank section do not cover end sections of the fuse element section. Hence, the bank section will not be damaged by the impact (pressure) in the melting of the fuse element section.

According to the chip fuse according to the third aspect of the invention, the chip fuse according to any one of the first and the second aspects of the invention is characterized in that: the surface electrode sections each include the first electrode section at the outer side in the chip fuse length direction, and the second electrode section at the inner side in the chip fuse length direction; the width of the second electrode section is narrower than the width of the first electrode section; the sections on both ends in the chip fuse width direction of the bank section are provided on the heat-storing layer and formed outwardly in the chip fuse width direction of the ends on both ends in the chip fuse width direction of the second electrode section; and the heat-storing layer and the bank section are formed of the same material. Accordingly, the sections on both ends in the chip fuse width direction of the bank section are provided on the heat-storing layer and adhere to the heat-storing layer as a whole. This increases the adhesion of the bank section and surely prevents the detachment.

According to the chip fuse according to the fourth aspect of the invention, the chip fuse according to the third aspect of the invention is characterized in that the heat-storing layer and the bank section are formed of the same photosensitive-group-containing material. Accordingly, the bank section formed of a photosensitive-group-containing material surely adheres to the heat-storing layer formed of the same photosensitive-group-containing material.

According to the chip fuse according to the fifth aspect of the invention, the chip fuse according to any one of the first to the fourth aspects of the invention is characterized in that the protective layer is formed of an epoxy-group-containing silicone-based resin. The protective layer formed of an epoxy-group-containing silicone-based resin is soft and elastic in comparison with a conventional protective layer formed of an epoxy-based resin. Accordingly, the protective layer is capable of absorbing an impact (pressure) in the melting of the fuse element section and thus is not likely to be damaged by the impact.

According to the chip fuse according to the sixth aspect of the invention, the chip fuse according to the fifth aspect of the invention is characterized in that another protective layer made of an inorganic-filler-containing silicone-based resin is formed on the protective layer. The other protective layer formed of an inorganic-filler-containing silicone-based resin is hard and excellent in friction resistance and blocking resistance in comparison with the protective layer formed of of an epoxy-group-containing silicone-based resin, and is hardly caught by manufacturing equipment and hardly detached. Hence, the productivity of the chip fuse is improved. Moreover, the other protective layer formed of the silicone-based resin closely adheres to the protective layer formed of a similar silicone-based resin, so that the other protective layer is less likely to be detached therefrom. Furthermore, since the other protective layer is formed of such an inorganic-filler-containing silicone-based resin, this makes it possible to improve the strength as a product.

According to the chip fuse according to the seventh aspect of the invention, the chip fuse according to the sixth aspect of the invention is characterized in that the other protective layer is formed to have a thickness smaller than the protective layer. The other protective layer is not only hard as being formed of an inorganic-filler-containing silicone-based resin and also has a thickness smaller than the protective layer. Accordingly, the elasticity of the protective layer is ensured. Hence, an impact (pressure) in the melting of the fuse element section is absorbed, making it possible to prevent damage by the impact, as well.

According to the chip fuse according to the eighth aspect of the invention, the chip fuse according to any one of the sixth and the seventh aspects of the invention is characterized in that: the other protective layer is transparent; and the mark made of a silicone-based resin is formed on the protective layer and provided between the protective layer and the other protective layer. Since the protective layer, the mark, and the other protective layer are formed of a silicone-based resin as a whole, they closely adhere to and are hardly detached from one another, and the absorbability of an impact (pressure) in the melting of the fuse element section is so high that the damage is little. This makes it possible to retain the mark and the protective layers.

According to the manufacturing method for a chip fuse according to the ninth aspect of the invention, the manufacturing method for the chip fuse according to any one of the first to the eighth aspects of the invention is characterized in that the manufacturing method includes: the first step of forming the rectangular bank section on the heat-storing layer and the surface electrode sections; and the second step of forming the protective layer on the inner side of the bank section. Accordingly, when the protective layer is formed in the second step, the rectangular bank section formed in the first step makes it possible to block the material for forming the protective layer (for example, epoxy-group-containing silicone-based resin) from flowing and spreading therearound. Thus, the thickness of the protective layer even at the end sections is not reduced, and a sufficiently large thickness is ensured. Hence, it is possible to prevent the protective layer from being damaged by the impact (pressure) in the melting of the fuse element section.

According to the manufacturing method for a chip fuse according to the tenth aspect of the invention, the manufacturing method for a chip fuse according to the ninth aspect of the invention is characterized in that the first step includes: laminating the sheet-shaped photosensitive-group-containing material on the fuse element section, the surface electrode sections, and the heat-storing layer; and exposing the sheet-shaped photosensitive-group-containing material to ultraviolet light for development (photo-etching) to thereby form the rectangular bank section. Accordingly, the bank section has a uniform thickness in comparison with a case where the bank section is formed by screen printing or the like, and an inner side surface that serves as a surface configured to block the flow of the material for forming the protective layer is perpendicular to a surface of the insulated substrate. Thus, it is possible to more surely ensure the thicknesses of the end sections of the protective layer.

BRIEF DESCRIPTION OF THE DRAWINGS

FIG. 1 is a cross-sectional view of a chip fuse according to an embodiment of the present invention (the cross section taken along the line B-B indicated by arrows in FIG. 2).

FIG. 2 is a top view of the chip fuse according to the embodiment of the present invention (the view seen in the direction of the arrow A in FIG. 1).

FIG. 3 is a top view of the chip fuse according to the embodiment of the present invention, the view showing a state where a first protective layer, a second protective layer, a mark, end surface electrodes, and copper films, nickel films, and tin films on the end surface electrodes are omitted.

FIGS. 4(*a*) to (*d*) are views for illustrating an insulated substrate scribing step, a heat-storing layer forming step, and a fuse film forming step in a manufacturing process for a chip fuse according to an embodiment of the present invention.

FIGS. 5(*a*) to (*d*) are views for illustrating the fuse film forming step in the manufacturing process for a chip fuse according to the embodiment of the present invention.

FIGS. 6(*a*) to (*c*) are views for illustrating a fuse element section forming step in the manufacturing process for a chip fuse according to the embodiment of the present invention.

FIGS. 7(*a*) and (*b*) are views for illustrating a bank section forming step in the manufacturing process for a chip fuse according to the embodiment of the present invention.

FIGS. 8(*a*) to (*d*) are views for illustrating a first protective layer forming step, a mark forming step, a second protective layer forming step, and other steps in the manufacturing process for a chip fuse according to the embodiment of the present invention.

FIG. 9 is a cross-sectional view of the chip fuse in a case where no bank section is formed.

FIG. 10(*a*) is a graph showing the interruption period (including the sustained arc period) of a conventional chip fuse in conducting Interruption Test B on the chip fuse, and FIG. 10(*b*) is a graph showing the interruption period (no sustained arc was observed) of the chip fuse of the present invention in conducting Interruption Test C on the chip fuse.

FIG. 11 is a drawing showing an appearance of the conventional chip fuse in conducting Interruption Test B on the chip fuse.

FIG. 12 is a cross-sectional view of the conventional chip fuse.

MODES FOR CARRYING OUT THE INVENTION

Hereinafter, embodiments of the present invention will be described in detail on the basis of the drawings.

First of all, a structure of a chip fuse 21 according to an embodiment of the present invention will be described based on FIGS. 1 to 3.

Note that FIG. 3 shows a state where a first protective layer 28, a second protective layer 29, a mark 30, end surface electrodes 32, and copper films 33, nickel films 34, and tin films 35 on the end surface electrodes 32, which are shown in FIG. 1, are omitted. Moreover, FIG. 3 shows that portions of a nickel film 25 and a tin film 26 on a fuse element section (fuse element) 24*b* and a surface electrode section 24*a* (second electrode section 24*a*-2) are cut away. FIG. 4(*d*) shows that a portion of a copper foil 52 is cut away. FIG. 5(*a*) shows that portions of the copper foil 52 and a photosensitive film 53 are cut away.

As shown in FIGS. 1 to 3, a heat-storing layer (adhesion layer) 23 made of a photosensitive-group-containing epoxy-based resin is formed on a surface 22*a* of an insulated substrate 22 that is an alumina substrate. A fuse film 24 made of copper is formed on the heat-storing layer 23. Specifically, interposing the heat-storing layer 23 between the insulated substrate 22 and the fuse film 24 prevents the fuse film 24 from coming into contact with the insulated substrate 22. Hence, when a current passes through the chip fuse 21, heat generated at a fuse element section 24*b* is stored in the heat-storing layer 23 without dissipating to the insulated substrate 22.

The fuse film 24 includes surface electrode sections 24*a* on both ends in a length direction of the chip fuse 21 (a right-left direction in FIGS. 1 to 3: hereinafter, this is simply referred to as chip fuse length direction), and the fuse element section 24*b* between the surface electrode sections 24*a*. The fuse element section 24*b* is a melting section configured to be melted by heat generated at the fuse element section 24*b* when an overcurrent flows through the chip fuse 21. The section has a width, that is, a width in a width direction of the chip fuse 21 (an up-down direction in FIGS. 2, 3: hereinafter, this is simply referred to as chip fuse width direction), narrower than the surface electrode sections 24*a*. Note that the fuse element section 24*b*, in the illustrated example, has a shape extending straight in the chip fuse length direction, but is not limited to this. The fuse element section 24*b* can be formed into an appropriate shape (for example, zigzag shape or the like) according to desired melting properties and so forth.

Moreover, the fuse element section 24*b* is provided with a plating film 25 for preventing diffusion and a plating film 26 for facilitating the melting. The plating film 25 is a nickel film formed on the copper fuse film 24 by an electroplating method. The plating film 26 is a tin film formed on the nickel film 25 by an electroplating method.

Each of the surface electrode sections 24*a* includes a first electrode section 24*a*-1 at an outer side in the chip fuse length direction, and a second electrode section 24*a*-2 at an inner side in the chip fuse length direction. The second electrode section 24*a*-2 has a width (width in the chip fuse width direction) W2 (FIG. 3) narrower than a width (width in the chip fuse width direction) W1 (FIG. 3) of the first electrode section 24*a*-1. Note that the plated nickel film 25 and tin film 26 are provided not only to the fuse element section 24*b* but also to the second electrode section 24*a*-2 of the surface electrode section 24*a* so as to adjust a variation in resistance value. Since the width W2 of the second electrode section 24*a*-2 is narrower than the width W1 of the first electrode section 24*a*-1, it is possible to adjust variations in thicknesses of the nickel film 25 and the tin film 26 after the plating, and a variation in resistance value.

Further, in the chip fuse 21 of the present embodiment, a bank section (dam) 27 made of a photosensitive-group-containing epoxy-based resin is formed. The bank section 27 has a rectangular shape (i.e., rectangular when seen from the above as shown in FIGS. 2 and 3), and is formed on the heat-storing layer 23 and the surface electrode sections 24*a* in such a manner as to surround the fuse element section 24*b*.

To be more specific, the rectangular bank section 27 includes sections 27*a* on both ends in the chip fuse length direction, and sections 27*b* on both ends in the chip fuse width direction.

The sections 27*b* on both ends in the chip fuse width direction extend straight in the chip fuse length direction, and are formed outwardly in the chip fuse width direction of ends 24*a*-3 on both ends in the chip fuse width direction of the surface electrode sections 24*a* (the second electrode sections 24*a*-2). Accordingly, the sections 27*b* on both ends in the chip fuse width direction each have a central section 27*b*-1 in the chip fuse length direction and end sections 27*b*-2 on both ends in the chip fuse length direction in such a manner that not only is the central section 27*b*-1 formed on the heat-storing layer 23, but the end sections 27*b*-2 are also formed on the heat-storing layer 23. Thus, the sections 27*b* adhere to the heat-storing layer 23 as a whole.

The sections 27*a* on both ends in the chip fuse length direction extend straight in the chip fuse width direction, have inner edges 27*a*-1 curved on both ends in the chip fuse width direction, and are formed on the surface electrode sections 24*a*. Moreover, the sections 27*a* on both ends in the chip fuse length direction are formed outwardly in the chip fuse length direction of ends 24*a*-4 at inner sides in the chip fuse length direction of the surface electrode sections 24*a* (the second electrode section 24*a*-2) (i.e., the ends 24*a*-4 are at boundary positions between the surface electrode sections 24*a* and the fuse element section 24*b*). It should be noted that, in the illustrated example, the sections 27*a* on both ends in the chip fuse length direction are formed on both of the first electrode section 24*a*-1 and the second electrode section 24*a*-2 of the surface electrode sections 24*a*.

A black first protective layer 28 made of an epoxy-group-containing silicone-based resin is formed on an inner side of the rectangular bank section 27, the first protective layer 28 serving as an undercoat. In other words, the first protective layer 28 is formed along an inner side surface 27*c* of the rectangular bank section 27 (FIG. 1). The first protective layer 28 is formed on the fuse element section 24*b* (the tin film 26) and also formed on the surface electrode sections 24*a* (the second electrode section 24*a*-2) and the heat-storing layer 23, covering the entire fuse element section 24*b* (the tin film 26), portions of the surface electrode sections 24*a* (the second electrode sections 24*a*-2), and a portion of the heat-storing layer 23. The first protective layer 28 formed of the epoxy-group-containing silicone-based resin is soft and elastic in comparison with a conventional protective layer formed of an epoxy-based resin.

On the first protective layer 28, a second protective layer 29 is formed which is made of a silicone-based resin containing an inorganic filler (for example, containing a silica powder and an alumina powder) and serves as a transparent overcoat. The second protective layer 29 formed of the inorganic-filler-containing silicone-based resin is hard in comparison with the first protective layer 28 formed of the epoxy-group-containing silicone-based resin. Hence, the second protective layer 29 is made to have a thickness smaller than the first protective layer 28 to thereby have an elasticity.

Further, using a silicone-based resin, a milky-white mark 30 is formed between the first protective layer 28 and the second protective layer 29. Specifically, after the mark 30 is formed on the first protective layer 28, the second protective layer 29 is formed on the first protective layer 28 in such a manner as to cover the mark 30. Since the second protective layer 29 is transparent, the mark 30 is seen through the second protective layer 29 from the above. The mark 30 indicates the rated current and the like of the chip fuse 21.

Backside electrodes 31 made of a silver-containing resin are formed on sections 22*b*-1 on both ends in the chip fuse length direction of a back surface 22*b* of the insulated substrate 22.

End surface electrodes 32 made of a silver-containing resin are formed on end surfaces 22*c* on both ends in the chip fuse length direction of the insulated substrate 22. Each of the end surface electrodes 32 is formed across from the surface electrode section 24*a* to the backside electrode 31, electrically connecting the surface electrode section 24*a* to the backside electrode 31.

In addition, the end surface electrode 32 is provided with the plating films 33, 34, 35. The plating film 33 is a copper film formed on the end surface electrode 32 by an electroplating method. The plating film 34 is a nickel film formed on the copper film 33 by an electroplating method. The plating film 35 is a tin film formed on the nickel film 34 by an electroplating method. These plating films 33, 34, 35 are formed across from the bank section 27 to the back surface 22*b* of the insulated substrate 22, covering the end surface electrode 32 and the backside electrode 31 entirely.

Next, a manufacturing process for the chip fuse 21 according to an embodiment of the present invention will be described based on FIGS. 1 to 9.

First of all, in an insulated substrate scribing step, multiple parallel first slits 41 and multiple parallel second slits 42 are formed in a surface 22*a* of a sheet-shaped insulated substrate (alumina substrate) 22 by a laser scribing method in such a manner that the first slits 41 and the second slits 42 are orthogonal to each other as shown in FIG. 4(*a*). As a result, multiple individual regions 43 are aligned consecutively in lengthwise and widthwise directions, one individual region 43 corresponding to one chip fuse 21. The first slits 41 and the second slits 42 cut the sheet-shaped insulated substrate 22 into strip shapes and further divide the insulated substrate 22 into the individual regions 43.

Subsequently, steps are performed on the multiple individual regions 43 until the insulated substrate 22 is divided by the first slits 41 and the second slits 42. FIGS. 4(*b*) to (*d*), FIGS. 5(*a*) to (*d*), FIGS. 6(*a*) to (*d*), FIGS. 7(*a*) and (*b*), and FIGS. 8(*a*) to (*d*) show only a portion corresponding to one individual region 43.

In the subsequent heat-storing layer forming step, first, a sheet-shaped photosensitive-group-containing material 51 in a B stage state is laminated on the insulated substrate 22 as shown in FIG. 4(*b*). The material is for forming a heat-storing layer 23.

Note that the method for laminating the sheet-shaped photosensitive-group-containing material 51 includes: a method in which a sheet-shaped photosensitive-group-containing material 51 formed to a size corresponding to that of one or multiple insulated substrates 22 in advance is laminated on the one or multiple insulated substrate 22; a method in which a large sheet-shaped photosensitive-group-containing material 51 is cut into a size corresponding to that of one or multiple insulated substrates 22 and laminated on the one or multiple insulated substrates 22; a method in which a photosensitive-group-containing material 51 wound into the shape of a roll is pulled out, formed into the shape of a sheet, and laminated on one or multiple insulated substrates 22; and the like.

Then, the sheet-shaped photosensitive-group-containing material 51 laminated on the insulated substrate 22 is exposed to ultraviolet light (UV) through a mask (the illustration is omitted) for development (photo-etching) to thereby form a heat-storing layer 23 with a pattern as shown in FIG. 4(*c*).

Here, as the sheet-shaped photosensitive-group-containing material 51 for forming the heat-storing layer 23, used is a photosensitive-group-containing epoxy-based resin formed in the shape of a sheet or roll. Note that, other than this, polyimides, silicone-based resins, polyesters, acrylic polymers, and the like, which contain a photosensitive group, and which are formed in the shape of a sheet or roll, can also be used as the sheet-shaped photosensitive-group-containing material 51 for forming the heat-storing layer 23.

In the subsequent fuse film forming step, first, a copper foil 52 is, laminated on the heat-storing layer 23 as shown in FIG. 4(*d*). The copper foil 52 is a material for forming a fuse film 24.

Then, as shown in FIG. 5(*a*), a photosensitive film (resist) 53 to serve as a mask is laminated on the copper foil 52. The photosensitive film 53 is exposed to ultraviolet light for development (photo-etching) to thereby create a pattern as shown in FIG. 5(*b*).

Subsequently, as shown in FIG. 5(*c*), the copper foil 52 is etched (patterned), and thereafter the photosensitive film 53 is detached. Thus, a fuse film 24 having a pattern as shown in FIG. 5(*d*) is formed. Specifically, the fuse film 24 has a structure having, as described above: surface electrode sections 24*a*, on both ends, each including a first electrode section 24*a*-1 having a wide width and a second electrode section 24*a*-2 having a narrow width; and a fuse element section 24*b* between the surface electrode sections 24*a*.

In the subsequent fuse element section forming step, as shown in FIG. 6(*a*), a resist 54 to serve as a mask is screen printed on the first electrode sections 24*a*-1 of the surface electrode sections 24*a*.

In this state, nickel plating and tin plating are sequentially performed by an electroplating method. Thereby, as shown in FIG. 6(*b*), plating films, a nickel film 25 and a tin film 26, are formed on the entire fuse element section 24*b* and the second electrode sections 24*a*-2 of the surface electrode sections 24*a*, on which the resist 54 is not formed.

Then, as shown in FIG. 6(*c*), the resist 54 is detached to expose the first electrode sections 24*a*-1 of the surface electrode sections 24*a*, on which the plating films 25, 26 are not formed.

Thereafter, in the subsequent bank section forming step, first, a photosensitive-group-containing material 55 in a B stage state formed in the shape of a sheet is laminated on the fuse element section 24*b*, the surface electrode sections 24*a*, and the heat-storing layer 23 as shown in FIG. 7(*a*). The material is for forming a bank section 27.

Note that the method for laminating the sheet-shaped photosensitive-group-containing material 55 includes: a method in which a sheet-shaped photosensitive-group-containing material 55 formed to a size corresponding to that of one or multiple insulated substrates 22 in advance is laminated on the fuse element section 24*b*, the surface electrode sections 24*a*, and the heat-storing layer 23 on the one or multiple insulated substrates 22; a method in which a large sheet-shaped photosensitive-group-containing material 55 is cut into a size corresponding to that of one or multiple insulated substrates 22 and laminated on the fuse element section 24*b*, the surface electrode sections 24*a*, and the heat-storing layer 23 on the one or multiple insulated substrates 22; a method in which a photosensitive-group-containing material 55 wound into the shape of a roll is pulled out, formed into the shape of a sheet, and laminated on the fuse element section 24*b*, the surface electrode sections 24*a*, and the heat-storing layer 23 on one or multiple insulated substrates 22; and the like.

Then, the sheet-shaped photosensitive-group-containing material 55 laminated on the fuse element section 24*b*, the surface electrode sections 24*a*, and the heat-storing layer 23 is exposed to ultraviolet light (UV) through a mask (the illustration is omitted) for development (photo-etching) to thereby form a bank section 27 with a pattern as shown in FIG. 7(*b*). Specifically, the bank section 27 formed has a rectangular structure including sections 27*a* on both ends in the chip fuse length direction and sections 27*b* on both ends in the chip fuse width direction as described above in such a manner that the sections 27*b* on both ends in the chip fuse width direction are formed on the heat-storing layer 23, and the sections 27*a* on both ends in the chip fuse length direction are formed on the surface electrode sections 24*a*.

Here, as the sheet-shaped photosensitive-group-containing material 55 for forming the bank section 27, used is a photosensitive-group-containing epoxy-based resin formed in the shape of a sheet or roll. Note that, other than this, polyimides, silicone-based resins, polyesters, acrylic polymers, and the like, which contain a photosensitive group, and which are formed in the shape of a sheet or roll, can also be used as the sheet-shaped photosensitive-group-containing material 55 for forming the bank section 27.

The bank section 27 formed of the photosensitive-group-containing material 55 is cured by irradiation with ultraviolet light. In this event, the bank section 27 contracts and the thickness thereof is reduced. For this reason, in the present embodiment, multiple sheet-shaped photosensitive-group-containing materials 55 each having a thickness of 20 to 60 μm are laminated on each other and then exposed to ultraviolet light for development (photo-etching) to form the bank section 27, and the bank section 27 is cured by irradiation with ultraviolet light. This ensures that the bank section 27 has a thickness of 5 to 100 μm in the product.

In the subsequent first protective layer forming step, using an epoxy-group-containing silicone-based resin, a black first protective layer 28 is formed on an inner side of the rectangular bank section 27 by screen printing as shown in FIG. 8(*a*).

Since the epoxy-group-containing silicone-based resin has a high flowability, if the bank section 27 is not formed, the silicone-based resin flows and spreads therearound after the screen printing. Consequently, the thicknesses of end sections 28*a* of the first protective layer 28 are reduced as shown in FIG. 9.

In contrast, in the present embodiment, the bank section 27 is formed. The bank section 27 (inner side surface 27*c*) makes it possible to block the silicone-based resin from flowing and spreading therearound after the screen printing. Consequently, as shown in FIG. 1, the thickness of the first protective layer 28 even at end sections 28*a* is not reduced, and a sufficiently large thickness is ensured.

The first protective layer 28 formed of the epoxy-group-containing silicone-based resin is soft and elastic in comparison with a conventional protective layer formed of an epoxy-based resin. Accordingly, the first protective layer 28 is capable of absorbing an impact (pressure) in the melting of the fuse element section 24*b* and thus is not likely to be damaged by the impact.

Moreover, since the bank section 27 ensures the thicknesses of the end sections 28*a* of the first protective layer 28 formed of the epoxy-group-containing silicone-based resin, the end sections 28*a* will not be damaged by the impact, either.

In addition, the first protective layer 28 formed of the epoxy-group-containing silicone-based resin is viscous in comparison with a protective layer formed of a silicone-based resin containing no epoxy group. This viscosity makes perforation by the impact less likely.

In the subsequent mark forming step, using a silicone-based resin, a milky-white mark 30 is formed on the first protective layer 28 by screen printing as shown in FIG. 8(*b*). As the silicone-based resin for forming the milky-white mark 30, for example, ones containing aluminium oxide, silica, carbon black, dimethylcyclosiloxane, or the like can be used.

In the subsequent second protective layer forming step, using a silicone-based resin containing an inorganic filler (for example, containing a silica powder and an alumina powder), a transparent second protective layer 29 is formed on the first protective layer 28 by screen printing in such a manner as to cover the mark 30 as shown in FIG. 8(*c*).

If the second protective layer 29 is as soft as the first protective layer 28, the second protective layer 29 is likely to be caught by manufacturing equipment and also likely to be detached, so that the chip fuse productivity is reduced. In contrast, in the present embodiment, the second protective layer 29 is formed of an inorganic-filler-containing silicone-based resin and made relatively hard. This makes it hard for the second protective layer 29 to be caught by the manufacturing equipment and detached, so that the chip fuse productivity is improved. Moreover, the second protective layer 29 formed of the silicone-based resin closely adheres to the first protective layer 28 formed of a similar silicone-based resin, so that the second protective layer 29 is less likely to be detached therefrom.

In addition, the second protective layer 29 is formed of such an inorganic-filler-containing silicone-based resin and hard and has a thickness smaller than the first protective layer 28. Thereby, the elasticity of the first protective layer 28 is ensured, and the impact (pressure) in the melting of the fuse element section 24*b* is absorbed, making it possible to prevent damage by the impact, as well.

Subsequently, steps such as a backside electrode forming step, a first dividing step, an end surface electrode forming step, a second dividing step, and an end surface electrode plating step are sequentially performed.

In the backside electrode forming step, using a silver-containing resin, backside electrodes 31 are formed on a back surface 22*b* of the insulated substrate 22 by screen printing (FIG. 1).

In the subsequent first dividing step, the sheet-shaped insulated substrate 22 is divided into strip shapes along the first slits 41 (FIG. 4(*a*)).

In the subsequent end surface electrode forming step, using a resin containing silver, nickel-chromium, titanium, or gold, end surface electrodes 32 are formed on end surfaces 22*c* of the insulated substrate 22 across from the surface electrode sections 24*a* to the backside electrodes 31, respectively, by printing, dipping, or sputtering (FIG. 1).

In the subsequent second dividing step, the insulated substrates 22 in the strip shapes are divided into the individual regions 43 along the second slits 42 (FIG. 4(*a*)).

In the subsequent end surface electrode plating step, copper plating, nickel plating, and tin plating are sequentially performed by an electroplating method. Thereby, a copper film 33, a nickel film 34, and a tin film 35 are formed across from the bank section 27 to the back surface 22*b* of the insulated substrate 22. These plating films 33, 34, 35 cover the end surface electrodes 32 and the backside electrodes 31 entirely.

Thus, the chip fuse 21 as shown in FIGS. 1 and 8(*d*) is manufactured.

As described above, in the chip fuse 21 of the present embodiment, the heat-storing layer 23 is formed on the insulated substrate 22; the fuse film is formed on the heat-storing layer 23, the fuse film including the surface electrode sections 24*a* on both ends in the chip fuse length direction and the fuse element section 24*b* between the surface electrode sections 24*a*; and the protective layer is formed on the fuse element section 24*b* (in the illustrated example, on the tin film 26 over the fuse element section 24*b*). The chip fuse 21 is characterized in that: the rectangular bank section 27 is formed on the heat-storing layer 23 and the surface electrode sections 24*a* in such a manner as to surround the fuse element section 24*b*; and the first protective layer 28 is formed on the inner side of the bank section 27. Accordingly, when the first protective layer 28 is formed, the rectangular bank section 27 makes it possible to block the epoxy-group-containing silicone-based resin, which is a material for forming the first protective layer 28, from flowing and spreading therearound. Thus, the thickness of the first protective layer 28 even at the end sections 28*a* is not reduced, and a sufficiently large thickness is ensured. Hence, it is possible to prevent the first protective layer 28 including the end sections 28*a* from being damaged by the impact (pressure) in the melting of the fuse element section 24*b*.

In contrast, if the bank section 27 is not formed, the thicknesses of the end sections 28*a* of the first protective layer 28 are reduced as shown in FIG. 9. Consequently, the end sections 28*a* are likely to be damaged particularly by the impact (pressure) in the melting of the fuse element section 24*b*.

Further, the chip fuse 21 of the present embodiment is characterized in that the sections 27*a* on both ends in the chip fuse length direction of the bank section 27 are formed outwardly in the chip fuse length direction of the ends 24*a*-4 at the inner sides in the chip fuse length direction of the surface electrode sections 24*a*. Accordingly, the sections 27*a* on both ends in the chip fuse length direction of the bank section 27 do not cover end sections of the fuse element section 24*b*. Hence, the bank section 27 will not be damaged by the impact (pressure) in the melting of the fuse element section.

Further, the chip fuse 21 of the present embodiment is characterized in that: the surface electrode sections 24*a* each include the first electrode section 24*a*-1 at the outer side in the chip fuse length direction, and the second electrode section 24*a*-2 at the inner side in the chip fuse length direction; the width W2 of the second electrode section 24*a*-2 is narrower than the width W1 of the first electrode section 24*a*-1; the sections 27*b* on both ends in the chip fuse width direction of the bank section 27 are provided on the heat-storing layer 23 and formed outwardly in the chip fuse width direction of the ends 24*a*-3 on both ends in the chip fuse width direction of the second electrode section 24*a*-2; and the heat-storing layer 23 and the bank section are formed of the same material (photosensitive-group-containing epoxy-based resin). Accordingly, the sections 27*b* on both ends in the chip fuse width direction of the bank section 27 are provided on the heat-storing layer 23 and adhere to the heat-storing layer 23 as a whole. This increases the adhesion of the bank section 27 and surely prevents the detachment.

Further, the chip fuse 21 of the present embodiment is characterized in that the first protective layer 28 is formed of an epoxy-group-containing silicone-based resin. The first protective layer 28 formed of an epoxy-group-containing silicone-based resin is soft and elastic in comparison with a conventional protective layer formed of an epoxy-based resin. Accordingly, the first protective layer 28 is capable of absorbing an impact (pressure) in the melting of the fuse element section 24*b* and thus is not likely to be damaged by the impact.

Further, the chip fuse 21 of the present embodiment is characterized in that the second protective layer 29 made of an inorganic-filler-containing silicone-based resin is formed on the first protective layer 28. The second protective layer 29 formed of an inorganic-filler-containing silicone-based resin is hard and excellent in friction resistance and blocking resistance in comparison with the first protective layer 28 formed of an epoxy-group-containing silicone-based resin, and is hardly caught by manufacturing equipment and hardly detached. Hence, the productivity of the chip fuse 21 is improved. Moreover, the second protective layer 29 formed of the silicone-based resin closely adheres to the first protective layer 28 formed of a similar silicone-based resin, so that the second protective layer 29 is less likely to be detached therefrom. Furthermore, since the second protective layer 29 is formed of such an inorganic-filler-containing silicone-based resin, this makes it possible to improve the strength as a product.

Further, the chip fuse 21 of the present embodiment is characterized in that the second protective layer 29 is formed to have a thickness smaller than the first protective layer 28. The second protective layer 29 formed of an inorganic-filler-containing silicone-based resin and having a thickness smaller than the first protective layer 28 ensures the elasticity of the first protective layer 28. Accordingly, an impact (pressure) in the melting of the fuse element section 24*b* is absorbed, making it possible to prevent damage by the impact, as well.

Further, the chip fuse 21 of the present embodiment is characterized in that: the second protective layer 29 is transparent; and the mark 30 made of a silicone-based resin is formed on the first protective layer 28 and provided between the first protective layer 28 and the second protective layer 29. Since the first protective layer 28, the mark 30, and the second protective layer 29 are formed of a silicone-based resin as a whole, they closely adhere to and are hardly detached from one another, and the absorbability of an impact (pressure) in the melting of the fuse element section 24*b* is so high that the damage is little.

Note that if the mark 30 is formed of an epoxy-based resin, the mark 30 poorly adheres to the first protective layer 28 formed of the silicone-based resin, and the mark 30 may be detached and fall off. Moreover, the mark 30 formed of an epoxy-based resin is hard and likely to be damaged by the impact (pressure) in the melting of the fuse element section 24*b*. Consequently, the effect of increasing an impact absorbability owing to the first protective layer 28 formed of an epoxy-group-containing silicone-based resin is reduced.

Further, the manufacturing method for the chip fuse 21 of the present embodiment is characterized in that the manufacturing method includes: the bank section forming step (first step) of forming the rectangular bank section 27 on the heat-storing layer 23 and the surface electrode sections 24*a*; and the first protective layer forming step (second step) of forming the first protective layer 28 on the inner side of the bank section 27. Accordingly, when the first protective layer 28 is formed in the first protective layer forming step (second step), the rectangular bank section 27 formed in the bank section forming step (first step) makes it possible to block the material for forming the first protective layer 28 (epoxy-group-containing silicone-based resin) from flowing and spreading therearound. Thus, the thickness of the first protective layer 28 even at the end sections 28*a* is not reduced, and a sufficiently large thickness is ensured. Hence, it is possible to prevent the first protective layer 28 including the end sections 28*a* from being damaged by the impact (pressure) in the melting of the fuse element section 24*b*.

Further, the manufacturing method for the chip fuse 21 of the present embodiment is characterized in that the bank section forming step (first step) includes: laminating the sheet-shaped photosensitive-group-containing material 55 on the fuse element section 24*b*, the surface electrode sections 24*a*, and the heat-storing layer 23; and exposing the sheet-shaped photosensitive-group-containing material 55 to ultraviolet light for development (photo-etching) to thereby form the rectangular bank section 27. Accordingly, the bank section 27 has a uniform thickness in comparison with a case where the bank section is formed by screen printing or the like, and the inner side surface 27*c* that serves as a surface configured to block the flow of the epoxy-group-containing silicone-based resin forming the first protective layer 28 is perpendicular to the surface 22*a* of the insulated substrate 22. Thus, it is possible to more surely ensure the thicknesses of the end sections 28*a* of the first protective layer 28.

Now, description will be given of the result of Interruption Test C conducted on the chip fuse 21 of the present embodiment.

Interruption Test C is an interruption test with 76 V and 50 A. The chip fuse 21 subjected to this Interruption Test C had a resistance value of 0.032Ω before the interruption test. As a result of conducting Interruption Test C, the interruption period was 0.14 ms, and no sustained arc was observed, as shown in FIG. 10(*b*). Moreover, the protective layers 28, 29 appeared to be not damaged even after the interruption (after the fuse element section 24*b* was melted). The chip fuse 21 retained the appearance as before the interruption (the state as shown in FIG. 2).

INDUSTRIAL APPLICABILITY

The present invention relates to the chip fuse and the manufacturing method for the same, and is usefully applied in cases of improving interruption performances of chip fuses, such as retention of appearance and reduction of sustained arc.

REFERENCE SIGNS LIST

21 CHIP FUSE
22 INSULATED SUBSTRATE (ALUMINA SUBSTRATE)
22*a* SURFACE
22*b* BACK SURFACE
22*b*-1 SECTIONS ON BOTH ENDS OF BACK SURFACE IN CHIP FUSE LENGTH DIRECTION
22*c* END SURFACE
23 HEAT-STORING LAYER (ADHESION LAYER)
24 FUSE FILM
24*a* SURFACE ELECTRODE SECTION
24*a*-1 FIRST ELECTRODE SECTION
24*a*-2 SECOND ELECTRODE SECTION
24*a*-3 ENDS ON BOTH ENDS IN CHIP FUSE WIDTH DIRECTION
24*a*-4 END AT INNER SIDE IN CHIP FUSE LENGTH DIRECTION
24*b* FUSE ELEMENT SECTION
25 PLATING FILM (NICKEL FILM)
26 PLATING FILM (TIN FILM)
27 BANK SECTION (DAM)
27*a* SECTIONS ON BOTH ENDS IN CHIP FUSE LENGTH DIRECTION
27*a*-1 INNER EDGES ON BOTH ENDS IN CHIP FUSE WIDTH DIRECTION
27*b* SECTIONS ON BOTH ENDS IN CHIP FUSE WIDTH DIRECTION
27*b*-1 CENTRAL SECTION IN CHIP FUSE LENGTH DIRECTION
27*b*-2 END SECTIONS ON BOTH ENDS IN CHIP FUSE LENGTH DIRECTION
27*c* INNER SIDE SURFACE
28 FIRST PROTECTIVE LAYER
28*a* END SECTION
29 SECOND PROTECTIVE LAYER
30 MARK
31 BACKSIDE ELECTRODE
32 END SURFACE ELECTRODE
33 PLATING FILM (COPPER FILM)
34 PLATING FILM (NICKEL FILM)
35 PLATING FILM (TIN FILM)
41 FIRST SLIT
42 SECOND SLIT
43 INDIVIDUAL REGION
51 SHEET-SHAPED PHOTOSENSITIVE-GROUP-CONTAINING MATERIAL
52 COPPER FOIL
53 PHOTOSENSITIVE FILM
43 RESIST
55 SHEET-SHAPED PHOTOSENSITIVE-GROUP-CONTAINING MATERIAL

The invention claimed is:

1. A chip fuse comprising:

an insulated substrate;

a heat-storing layer formed on the insulated substrate;

a fuse film formed on the heat-storing layer, the fuse film comprising surface electrode sections on both ends in a chip fuse length direction and a fuse element section between the surface electrode sections; and a protective layer formed on the fuse element section, wherein a rectangular bank section is formed on the heat-storing layer and the surface electrode sections in such a manner as to surround the fuse element section, the rectangular bank section has a first surface that extends vertically in a height direction of the chip fuse, and the protective layer is formed on an inner side of the bank section, the protective layer has a second surface that extends vertically in the height direction and opposes the first surface, the second surface making contact with the first surface.

2. The chip fuse according to claim 1, wherein the bank section includes sections on both ends in the chip fuse length direction, the sections being formed outwardly in the chip fuse length direction of ends at inner sides in the chip fuse length direction of the surface electrode sections.

3. The chip fuse according to claim 1, wherein the surface electrode sections each include a first electrode section at an outer side in the chip fuse length direction, and a second electrode section at an inner side in the chip fuse length direction, the second electrode section has a width narrower than a width of the first electrode section, the bank section includes sections on both ends in a chip fuse width direction, the sections being provided on the heat-storing layer and formed outwardly in the chip fuse width direction of ends on both ends in the chip fuse width direction of the second electrode section, and the heat-storing layer and the bank section are formed of the same material.

4. The chip fuse according to claim 3, wherein the heat-storing layer and the bank section are formed of the same photosensitive-group-containing material.

5. The chip fuse according to claim 1, wherein the protective layer is formed of an epoxy-group-containing silicone-based resin.

6. The chip fuse according to claim 5, wherein another protective layer made of an inorganic-filler-containing silicone-based resin is formed on the protective layer.

7. The chip fuse according to claim 6, wherein the other protective layer is formed to have a thickness smaller than the protective layer.

8. The chip fuse according to claim 6, wherein the other protective layer is transparent, and a mark made of a silicone-based resin is formed on the protective layer and provided between the protective layer and the other protective layer.

9. The chip fuse according to claim 2, wherein the surface electrode sections each include a first electrode section at an outer side in the chip fuse length direction, and a second electrode section at an inner side in the chip fuse length direction, the second electrode section has a width narrower than a width of the first electrode section, the bank section includes sections on both ends in a chip fuse width direction, the sections being provided on the heat-storing layer and formed outwardly in the chip fuse width direction of ends on both ends in the chip fuse width direction of the second electrode section, and the heat-storing layer and the bank section are formed of the same material.

10. The chip fuse according to claim 9, wherein the heat-storing layer and the bank section are formed of the same photosensitive-group-containing material.

11. The chip fuse according to claim 7, wherein the other protective layer is transparent, and a mark made of a silicone-based resin is formed on the protective layer and provided between the protective layer and the other protective layer.

12. A manufacturing method for the chip fuse that includes, an insulated substrate;

a heat-storing layer formed on the insulated substrate;

a fuse film formed on the heat-storing layer, the fuse film comprising surface electrode sections on both ends in a chip fuse length direction and a fuse element section between the surface electrode sections; and a protective layer formed on the fuse element section, wherein a rectangular bank section is formed on the heat-storing layer and the surface electrode sections in such a manner as to surround the fuse element section, the rectangular bank section has a first surface that extends vertically in a height direction of the chip fuse, and the protective layer is formed on an inner side of the bank section, the manufacturing method comprises:

a first step of forming the rectangular bank section on the heat-storing layer and the surface electrode sections; and a second step of forming the protective layer on the inner side of the bank section, the protective layer has a second surface that extends vertically in the height direction and opposes the first surface, the second surface making contact with the first surface.

13. The manufacturing method for the chip fuse according to claim 12, wherein the first step includes:

laminating a sheet-shaped photosensitive-group-containing material on the fuse element section, the surface electrode sections, and the heat-storing layer; and exposing the sheet-shaped photosensitive-group-containing material to ultraviolet light for development to thereby form the rectangular bank section.

* * * * *